US011615835B2

(12) United States Patent
Lee et al.

(10) Patent No.: US 11,615,835 B2
(45) Date of Patent: Mar. 28, 2023

(54) MEMORY DEVICE

(71) Applicant: SK hynix Inc., Gyeonggi-do (KR)

(72) Inventors: Hyun Soo Lee, Gyeonggi-do (KR);
Byung Hyun Jeon, Gyeonggi-do (KR);
Sun Young Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/349,380

(22) Filed: Jun. 16, 2021

(65) Prior Publication Data

US 2022/0180921 A1     Jun. 9, 2022

(30) Foreign Application Priority Data

Dec. 3, 2020   (KR) .................. 10-2020-0167788

(51) Int. Cl.
| | | |
|---|---|---|
| *G11C 11/34* | (2006.01) | |
| *G11C 11/4099* | (2006.01) | |
| *G11C 11/4093* | (2006.01) | |
| *G11C 11/4074* | (2006.01) | |
| *G11C 11/4094* | (2006.01) | |

(52) U.S. Cl.
CPC ...... *G11C 11/4099* (2013.01); *G11C 11/4074* (2013.01); *G11C 11/4093* (2013.01); *G11C 11/4094* (2013.01)

(58) Field of Classification Search
CPC ............ G11C 11/4099; G11C 11/4074; G11C 11/4093; G11C 11/4094
USPC ...................................... 365/185.2
See application file for complete search history.

(56) References Cited

U.S. PATENT DOCUMENTS

| | | | | | |
|---|---|---|---|---|---|
| 6,781,904 B2* | 8/2004 | Lee | ........................ | G11C 16/24 | |
| | | | | 365/207 | |
| 6,901,017 B2* | 5/2005 | Shimizu | ................... | G11C 7/12 | |
| | | | | 365/154 | |
| 7,120,054 B2* | 10/2006 | Abedifard | ................ | G11C 7/12 | |
| | | | | 365/204 | |
| 7,889,546 B2* | 2/2011 | Park | ................... | G11C 13/0004 | |
| | | | | 365/204 | |
| 8,305,806 B2* | 11/2012 | Choi | ...................... | G11C 16/08 | |
| | | | | 365/185.13 | |

(Continued)

FOREIGN PATENT DOCUMENTS

KR   10-2021-0098145 A   8/2021

OTHER PUBLICATIONS

Italian Patent Application No. 102020000005104 filed on Mar. 10, 2020.

*Primary Examiner* — Viet Q Nguyen
(74) *Attorney, Agent, or Firm* — IP & T Group LLP

(57) ABSTRACT

A memory device includes an open-for-contact region located between the memory blocks, and a row decoder disposed between global lines to which an operating voltage is supplied and the local lines and configured to transfer the operating voltage to one memory block among the memory blocks in response to a row address, wherein a plurality of contacts are formed in the open-for-contact region and configured to transmit a voltage between the bit lines and a peripheral circuit, wherein a dummy region is included in the row decoder and disposed paced apart from the open-for-contact region in the second direction, and wherein a discharge switch is included in the dummy region and configured to discharge the global lines in response to a discharge signal.

18 Claims, 11 Drawing Sheets

(56) References Cited

U.S. PATENT DOCUMENTS

| | | | | |
|---|---|---|---|---|
| 8,363,482 B2* | 1/2013 | Kim | ................ | G11C 16/06 |
| | | | | 365/185.25 |
| 8,842,487 B2* | 9/2014 | Behrends | ............ | G11C 11/419 |
| | | | | 365/63 |
| 9,058,866 B2* | 6/2015 | Freiburger | ............ | G11C 7/18 |
| 9,466,372 B2* | 10/2016 | An | ................ | G11C 16/08 |
| 9,514,822 B2* | 12/2016 | Lee | ................ | G11C 5/025 |
| 9,653,562 B2* | 5/2017 | Kim | ............ | H01L 27/11529 |
| 9,685,237 B2* | 6/2017 | Park | ................ | G11C 16/08 |
| 10,163,512 B2* | 12/2018 | Lee | ................ | G11C 8/08 |

* cited by examiner

MEMORY DEVICE

CROSS-REFERENCE TO RELATED APPLICATION

The present application claims priority under 35 U.S.C. § 119(a) to Korean patent application number 10-2020-0167788 filed on Dec. 3, 2020, and which is incorporated herein by reference in its entirety.

BACKGROUND

Field of Invention

The present disclosure generally relates to a memory device, and more particularly, to a memory device including a memory block and a row decoder.

Description of Related Art

A memory device may include a volatile memory device in which stored data disappears when the supply of power is interrupted and a nonvolatile memory device in which stored data is retained even when the supply of power is interrupted.

The volatile memory device may include a dynamic random access memory (DRAM) and a static random access memory (SRAM). The nonvolatile memory device may include a read only memory (ROM), a programmable read only memory (PROM), an erasable PROM (EPROM), an electrically EPROM (EEPROM), a NAND flash, and the like.

The memory device may include a memory cell array, a peripheral circuit, and a logic circuit.

The memory cell array may include memory blocks including a plurality of memory cells. The memory blocks may be formed in a two-dimensional or three-dimensional structure. For example, the memory blocks having the two-dimensional structure may include memory cells arranged in parallel to a substrate. The memory blocks having the three-dimensional structure may include memory cells stacked vertically to a substrate.

The use of a three-dimensional memory block capable of improving the degree of integration has recently increased.

Since memory cells are stacked on a substrate in the three-dimensional memory block, word lines connected to the memory cells may also be stacked. Since a large number of metal lines in addition to the word lines are used in a memory device, the memory device may include a plurality of contacts for transmitting a voltage between these lines.

SUMMARY

Various embodiments of the present disclosure provide a memory device in which a transistor is formed in a dummy region which is not used in the memory device, so that the size of a peripheral circuit can decrease.

In accordance with an aspect of the present disclosure, there is provided a memory device including: memory blocks disposed spaced apart from each other in a first direction and connected to bit lines disposed spaced apart from each other in a second direction perpendicular to the first direction and local lines disposed spaced apart from each other in the first direction, an open-for-contact region located between the memory blocks, and a row decoder disposed between global lines to which an operating voltage is supplied and the local lines and configured to transfer the operating voltage to one memory block among the memory blocks in response to a row address, wherein a plurality of contacts are formed in the open-for-contact region and configured to transmit a voltage between the bit lines and a peripheral circuit, wherein a dummy region is included in the row decoder and disposed paced apart from the open-for-contact region in the second direction, and wherein a discharge switch is included in the dummy region and configured to discharge the global lines in response to a discharge signal.

In accordance with another aspect of the present disclosure, there is provided a memory device including: a plurality of memory blocks, global lines to which an operating voltage is applied, local lines connected to each of the memory blocks, a plurality of high voltage switches and a plurality of pass switch groups configured to connect the local lines, which are connected to a selected memory block among the memory blocks, to the global lines in response to a row address, and a discharge switch located between the pass switch groups and configured to discharge the global lines in response to a discharge signal.

In accordance with still another aspect of the present disclosure, there is provided a memory device including: memory blocks configured to store data and connected to local lines and bit lines, page buffers connected to the bit lines through contacts and located between the memory blocks and a substrate, a voltage generator configured to generate operating voltages and output the operating voltages to global lines, pass switch groups configured to transmit the operating voltages to a selected memory block among the memory blocks, and a discharge switch located between the pass switch groups and configured to discharge the global lines in response to a discharge signal.

In accordance with another aspect of the present disclosure, there is provided a memory device including: a memory block disposed on a substrate, coupled to bit lines spaced apart from each other in a second direction and coupled to local lines spaced apart from each other in a first direction perpendicular to the second direction, contacts disposed adjacent to the memory block in the first direction and configured to electrically couple the bit lines to page buffers disposed between the memory block and the substrate, a pass switch group disposed adjacent to the memory block in the second direction and configured to electrically couple the local lines to global lines, and a discharge switch disposed adjacent to the contacts in the second direction and adjacent to the pass switch group in the first direction and configured to discharge the global lines.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Figure 1:
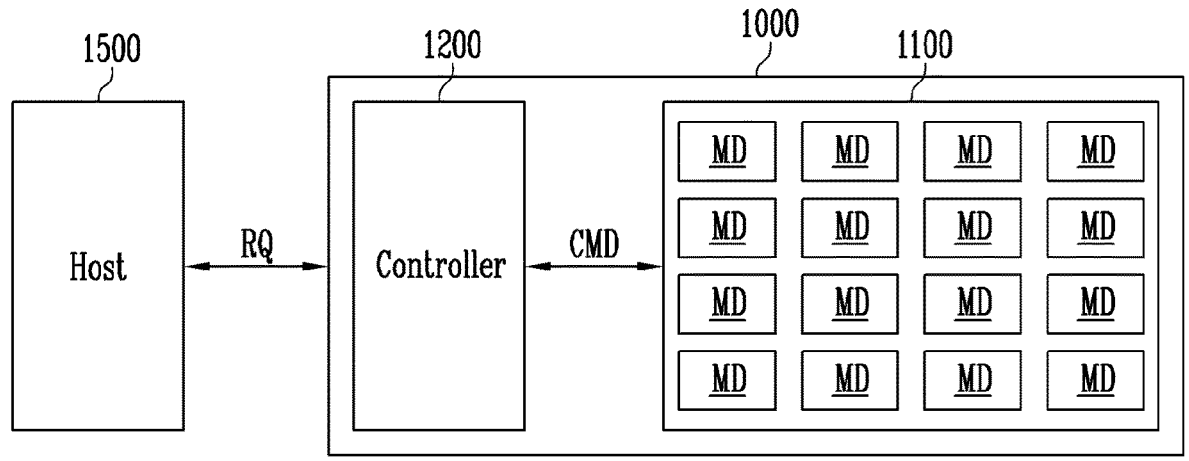
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a storage device 1100 and a controller 1200. The storage device 1100 may include a plurality of memory devices MD, and the memory devices MD may be connected to the controller 1200 through input/output lines.

The controller 1200 may communicate between a host 1500 and the storage device 1100. The controller 1200 may generate a command CMD for controlling the memory devices MD included in the storage device 1100 according to a request RQ of the host 1500, and perform a background operation for improving performance of the memory system 1000 even when the request RQ of the host 1500 does not exist.

The host 1500 may generate requests RQ for various operations, and output the generated requests RQ to the memory system 1000. For example, the requests RQ may include a program request capable of controlling a program operation, a read request capable of controlling a read operation, an erase request capable of controlling an erase operation, and the like.

The host 1500 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

Figure 2:
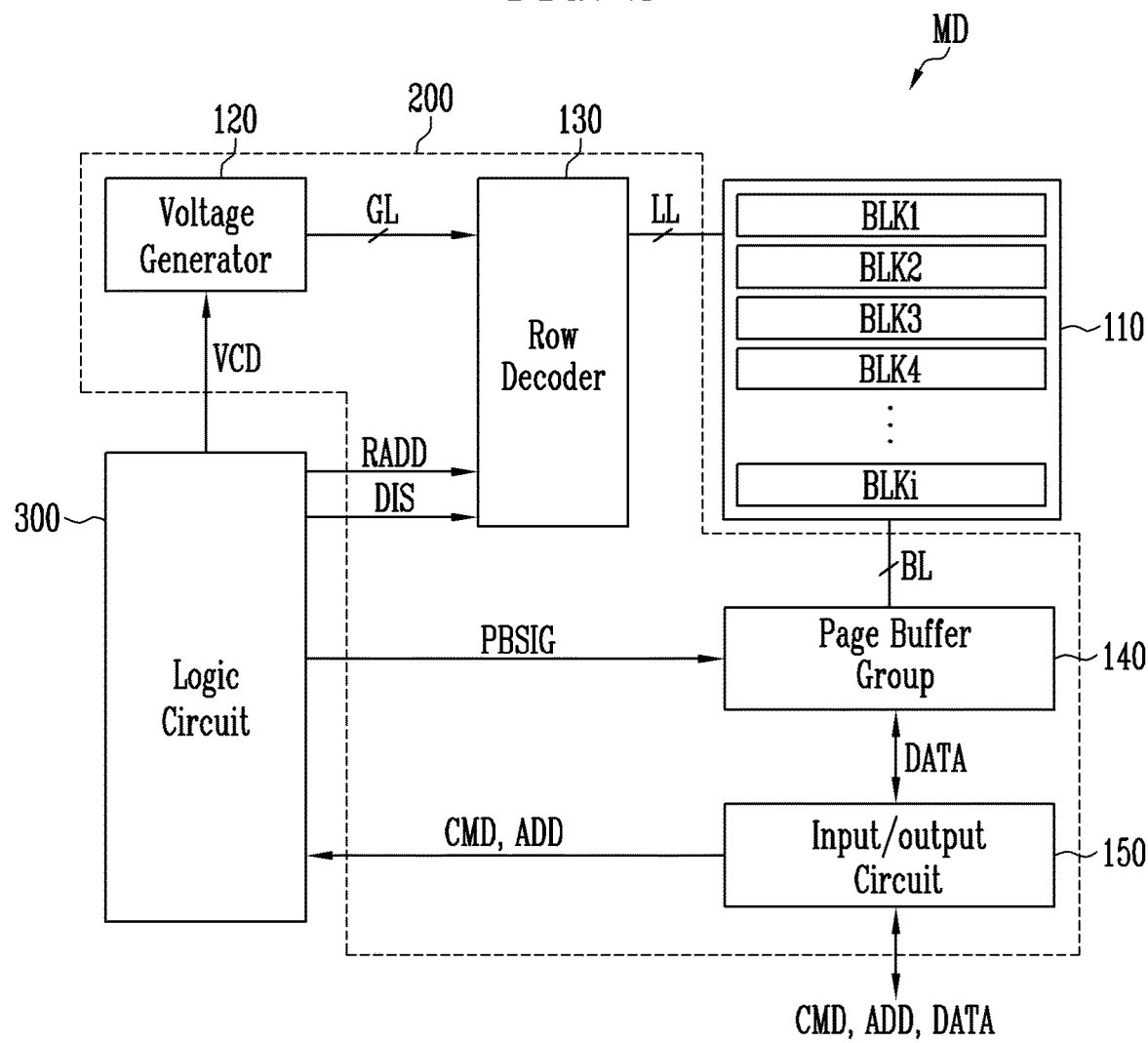
FIG. 2 is a diagram illustrating a memory device in accordance with an embodiment of the present disclosure.

FIG. 2 is a diagram illustrating a memory device in accordance with an embodiment of the present disclosure.

Referring to FIG. 2, the memory device MD may include a memory cell array 110 in which data is stored, a peripheral circuit 200 configured to perform a program, read or erase operation, and a logic circuit 300 for controlling the peripheral circuit 200.

The memory cell array 110 may include a plurality of memory blocks BLK1 to BLKi in which data is stored. Each of the memory blocks BLK1 to BLKi may include a plurality of memory cells, and the memory cells may be implemented in a three-dimensional structure in which the memory cells are stacked in a vertical direction over a substrate.

The peripheral circuit 200 may include a voltage generator 120, a row decoder 130, a page buffer group 140, and an input/output circuit 150.

The voltage generator 120 may generate operating voltages necessary for various operations in response to a voltage code VCD, and output the operating voltages through global lines GL. For example, the voltage generator 120 may generate and output a program voltage, a verify voltage, a read voltage, a pass voltage, an erase voltage, and the like, which have various levels.

The row decoder 130 may select one memory block among the memory blocks BLK1 to BLKi included in the memory cell array 110 according to a row address RADD, and transmit the operating voltages to the selected memory block through local lines LL. The row decoder 130 may discharge the global lines GL in response to a discharge signal DIS. For example, when the global lines GL are discharged, a voltage of the global lines GL may become 0V or a negative voltage.

The page buffer group 140 may be connected to the memory cell array 110 through bit lines BL. For example, the page buffer group 140 may include page buffers connected to the respective bit lines BL. The page buffers may simultaneously operate in response to page buffer control signals PBSIG, and temporarily store data in the program or read operation. A verify operation performed in the program operation and a verify operation performed in the erase operation may be performed in the same manner as the read operation. The page buffers may sense a voltage of the bit lines, which is changed according to threshold voltages of memory cells, in the read operation or verify operation. That is, whether the threshold voltages of the memory cells are lower or higher than the read voltage, or the verify voltage may be determined based on a result of a sensing operation performed by the page buffers.

The input/output circuit 150 may be connected to the controller (1200 shown in FIG. 1) through input/output lines. The input/output circuit 150 may input/output a command CMD, an address ADD, and data DATA through the input/output lines. For example, the input/output circuit 150 may transmit, to the logic circuit 300, the command CMD and the address ADD, which are received through the input/output lines, and transmit the data received through the input/output lines to the page buffer group 140. The input/output circuit 150 may output data DATA received from the page buffer group 140 to the controller 1200 through the input/output lines.

The logic circuit 300 may output the voltage code VCD, the row address RADD, the discharge signal DIS, and the page buffer control signals PBSIG in response to the command CMD and the address ADD. For example, the logic circuit 300 may include software for performing an algorithm in response to the command CMD and hardware configured to output various signals according to the address ADD and the algorithm. The logic circuit 300 may output the discharge signal DIS to discharge the global lines GL, after a selected operation is performed in the selected memory block. Alternatively, the logic circuit 300 may output the discharge signal DIS to discharge the global lines GL and the local lines LL, after a selected operation is performed in the selected memory block.

Figure 3:
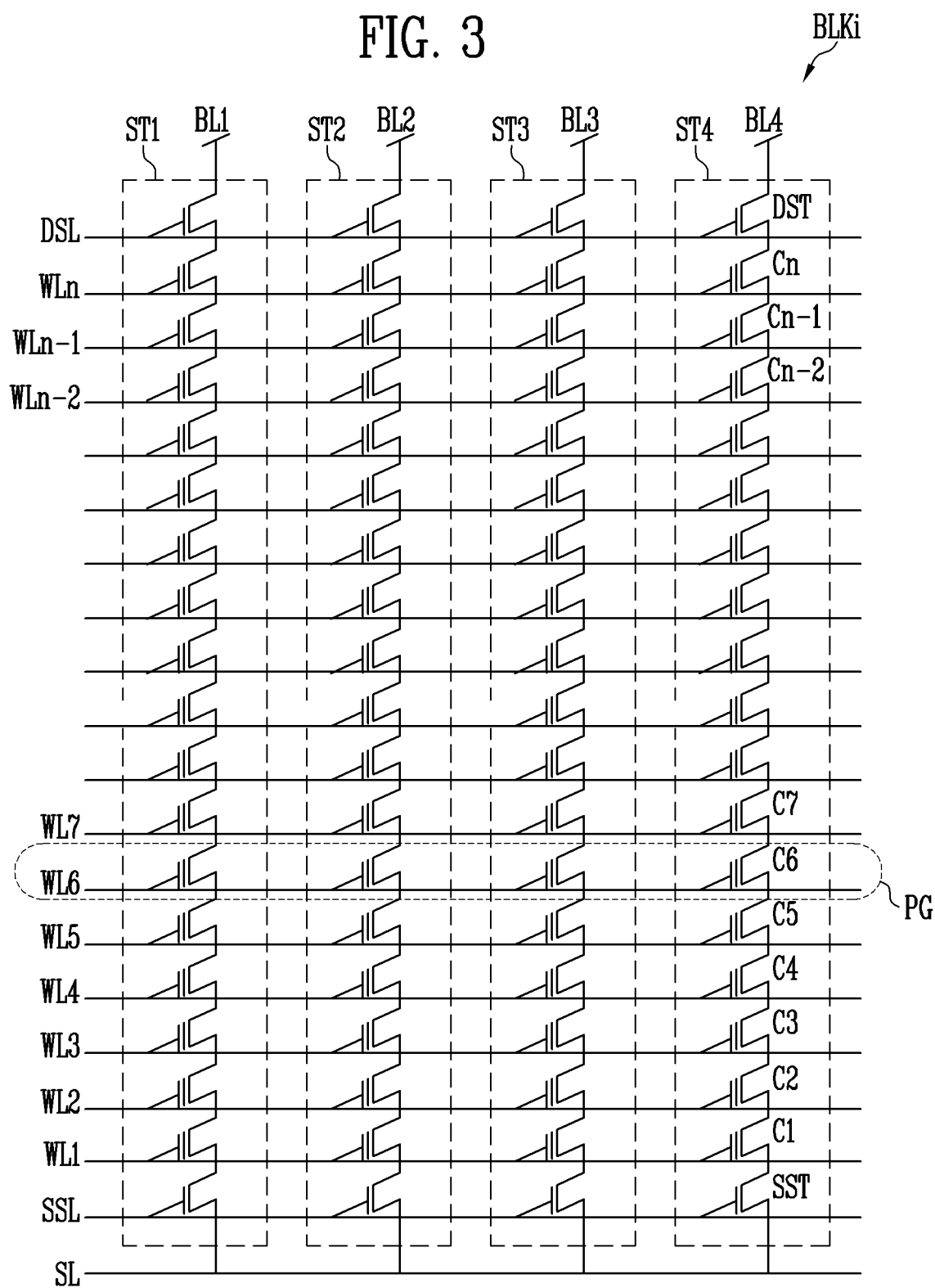
FIG. 3 is a circuit diagram illustrating a memory block.

FIG. 3 is a circuit diagram illustrating a memory block, and an ith memory block BLKi among the plurality of memory blocks BLK1 to BLKi shown in FIG. 2 is illustrated as an example.

Referring to FIG. 3, the ith memory block BLKi may include a plurality of strings ST1 to ST4. Although first to fourth strings ST1 to ST4 are illustrated in FIG. 3, a number of strings of which is greater than that of the first to fourth strings ST1 to ST4 may be included in the ith memory block BLKi.

The first to fourth strings ST1 to ST4 may be connected between bit lines BL1 to BL4 and a source line SL. For example, the first string ST1 may be connected between a first bit line BL1 and the source line SL, and the second string ST2 may be connected between a second bit line BL2 and the source line SL.

Each of the first to fourth strings ST1 to ST4 may include a source select transistor SST, a plurality of memory cells Cl to Cn, and a drain select transistor DST. Although not shown in drawing, dummy cells may be further included between the memory cells Cl to Cn and the source or drain select transistor SST or DST. In order to describe a configuration of the string, the fourth string ST4 will be described as an example.

A source select transistor SST included in the fourth string ST4 may electrically connect the source line SL and a first memory cell Cl to each other or block connection between the source line SL and the first memory cell Cl according to a voltage applied to a source select line SSL. Gates of first to nth memory cells Cl to Cn may be respectively connected to first to nth word lines WL1 to WLn. A drain select transistor DST included in the fourth string ST4 may electrically connect a fourth bit line BL14 and the nth memory cell Cn to each other or block connection between the fourth bit line BL14 and the nth memory cell Cn according to a voltage applied to a drain select line DSL. Gates of source select transistors SST included in different strings ST1 to ST4 may be commonly connected to the source select line SSL, and gates of drain select transistors DST included in different strings ST1 to ST4 may be commonly connected to the drain select line DSL. A group of memory cells connected to the same word line is referred to as a page PG, and program and read operations may be performed in units of pages PG.

A program operation will be described as an example. A program voltage may be applied to a selected word line connected to a selected page, and a pass voltage may be applied to the other unselected word lines. The program voltage is a voltage for increasing threshold voltages of selected memory cells, and the pass voltage is for forming a channel in strings by turning on unselected memory cells included in the strings. For example, when the sixth word line WL6 is a selected word line, the first to fifth and seventh to nth word lines WL1 to WL5 and WL7 to WLn may become unselected word lines. The program operation may be performed in a direction from the source select line SSL to the drain select line DSL, or be performed in a direction from the drain select line DSL to the source select line SSL.

Figure 4:
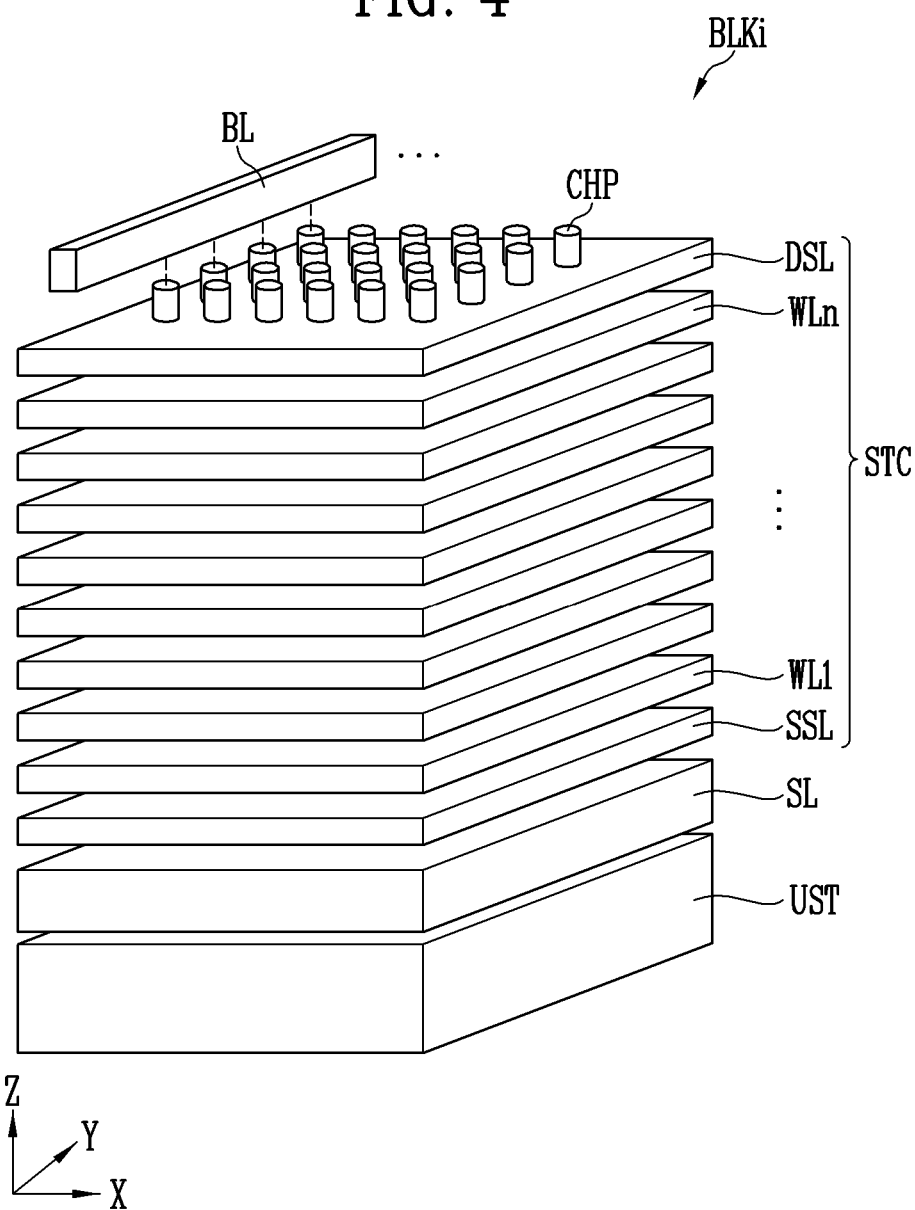
FIG. 4 is a perspective view illustrating a memory block.

FIG. 4 is a perspective view illustrating a memory block, and an ith memory block BLKi among the plurality of memory blocks BLK1 to BLKi shown in FIG. 2 is illustrated as an example.

Referring to FIG. 4, in the ith memory block BLKi formed in a three-dimensional structure, a source line SL may be formed on the top of a lower structure UST, and a stack structure STC including memory cells may be formed on the source line SL. The lower structure UST may be a substrate or include the substrate and a peripheral circuit. For example, a portion of the peripheral circuit may be formed on the substrate, and the source line SL may be formed on the top of the portion of the peripheral circuit.

The stack structure STC may include a source select line SSL, first to nth word lines WL1 to WLn, and a drain select line DSL, which are sequentially stacked. Channel plugs CHP may be formed to penetrate the source select line SSL, the first to nth word lines WL1 to WLn, and the drain select line DSL in a vertical direction Z. The channel plug CHP may include a memory layer in which electrons can be trapped and a channel layer in which a channel can be formed. For example, the channel plug CHP may include a channel layer, and a tunnel insulating layer, a memory layer, and a blocking layer, which surround the channel layer.

A source select transistor may be formed in a region in which the channel plug CHP and the source select line SSL overlap with each other, memory cells may be formed in regions in which the channel plug CHP and the first to nth word lines WL1 to WLn overlap with each other, and a drain select transistor may be formed in a region in which the channel plug CHP and the drain select line DSL overlap with each other. The first to nth word lines WL1 to WLn may be formed in a plane X-Y parallel to the lower structure UST, and extend in an X direction. Bit lines BL may be formed on the top of the channel plugs CHP. The bit lines BL may be in contact with the channel plugs CHP while extending in a Y direction and are spaced apart from each other in the X direction.

As shown in FIG. 4, the ith memory block BLKi may be formed in a three-dimensional structure, and the other memory blocks included in the memory cell array may be formed in the same structure as the ith memory block BLKi. When the memory blocks included in the memory cell array are formed in a three-dimensional structure, contacts for supplying a voltage to the bit lines BL, the source select line SSL, the first to nth word lines WL1 to WLn, and the drain select line DSL may be formed in partial regions of the memory cell array. The memory cells are not formed in the regions in which the contacts are formed. In this embodiment, these regions are defined as open-for-contact regions.

Figure 5:
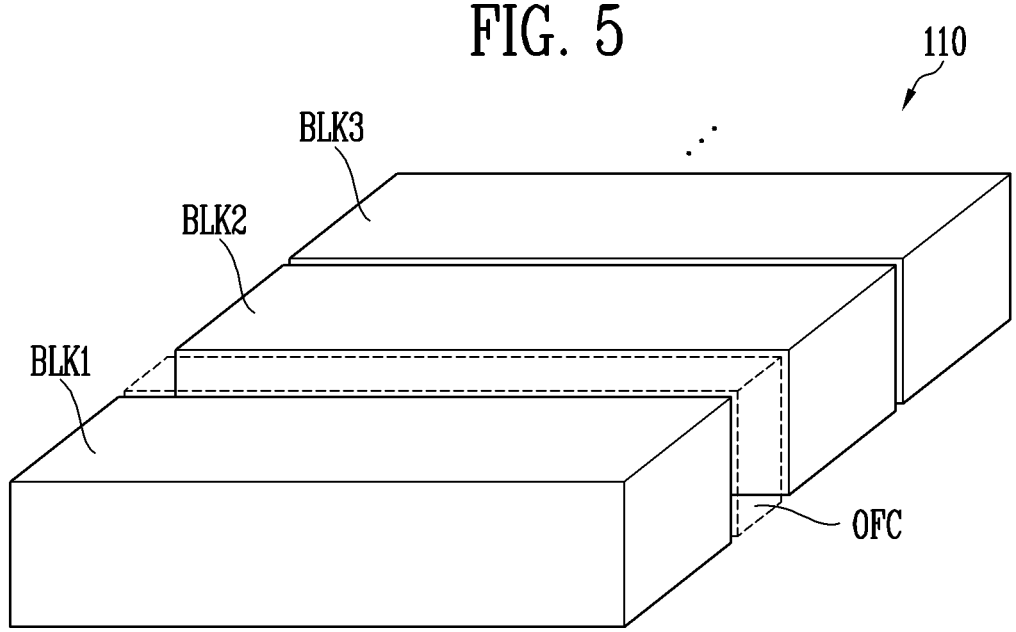
FIG. 5 is a view illustrating an open-for-contact region in accordance with an embodiment of the present disclosure.
Figure 6:
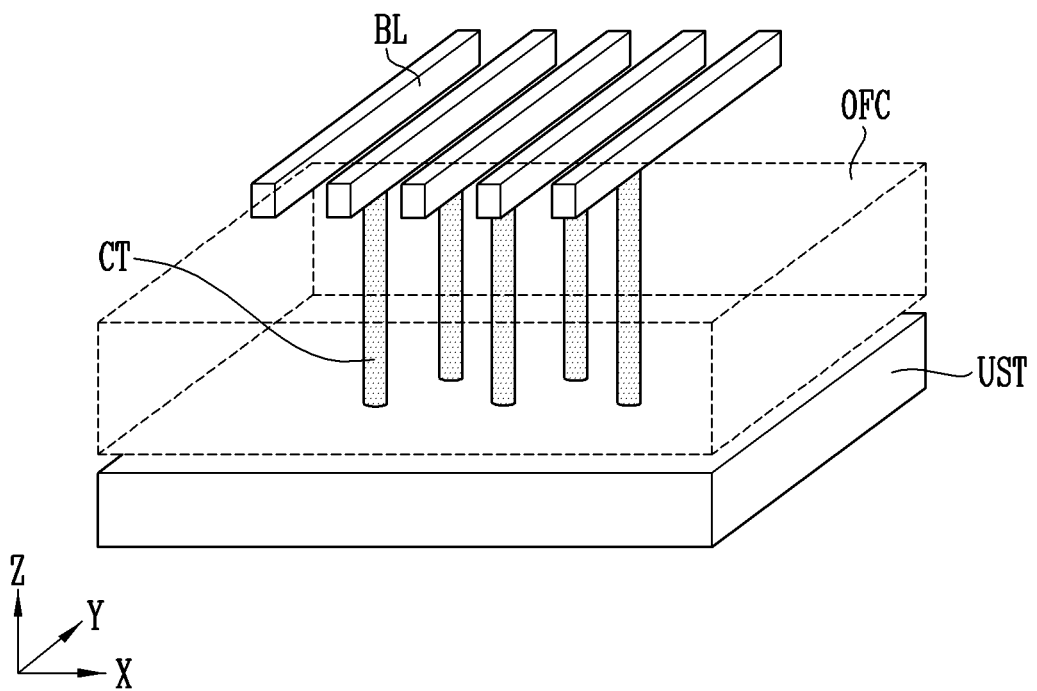
FIG. 6 is a view illustrating in more detail the open-for-contact region in accordance with an embodiment of the present disclosure.

FIG. 5 is a view illustrating an open-for-contact region in accordance with an embodiment of the present disclosure. FIG. 6 is a view illustrating in more detail the open-for-contact region in accordance with an embodiment of the present disclosure.

Referring to FIGS. 5 and 6, a plurality of memory blocks may be included in the memory cell array 110. In FIG. 5, first to third memory blocks BLK1 to BLK3 among the plurality of memory blocks are illustrated as an example.

In an embodiment, each of the first to third memory blocks BLK1 to BLK3 may be configured similar to the ith memory block BLKi shown in FIG. 4. Therefore, an openfor-contact region OFC may be included between some memory blocks among the first to third memory blocks BLK1 to BLK3. For helping to understand this embodiment, a case where the open-for-contact region OFC is located between the first and second memory blocks BLK1 and BLK2 is illustrated in FIG. 5. However, the number and positions of open-for-contact regions OFC may be changed according to the memory cell array 110.

Since contacts are formed in the open-for-contact region OFC included in the memory cell array 110, memory cells are not formed in the open-for-contact region OFC. For example, an insulating material is filled in the open-for-contact region OFC, and a plurality of contacts CT may be formed to penetrate the open-for-contact region OFC in the vertical direction Z. The contacts CT may be connected to voltage supply lines (not shown) included in a lower structure UST. For example, in a peri under cell (PUC) structure in which a portion of a peripheral circuit is formed in the lower structure UST, a portion of the peripheral circuit may be formed between a substrate and the memory blocks. For example, a page buffer group included in the peripheral circuit may be located between the substrate and the memory blocks, and the bottoms of the contacts CT may be connected to the page buffer group. Bit lines BL may be respectively connected to tops of the contacts CT. For example, the bit lines BL may extend in the Y direction and may be formed spaced apart from each other in the X direction.

In a manufacturing process of the memory device, when the open-for-contact region OFC is formed in the memory cell array 110, memory cells are not formed in the open-for-contact region OFC, and therefore, a dummy region may be formed in the peripheral circuit, the dummy region corresponding to the open-for-contact region OFC. The peripheral circuit including the dummy region will be described as follows.

Figure 7:
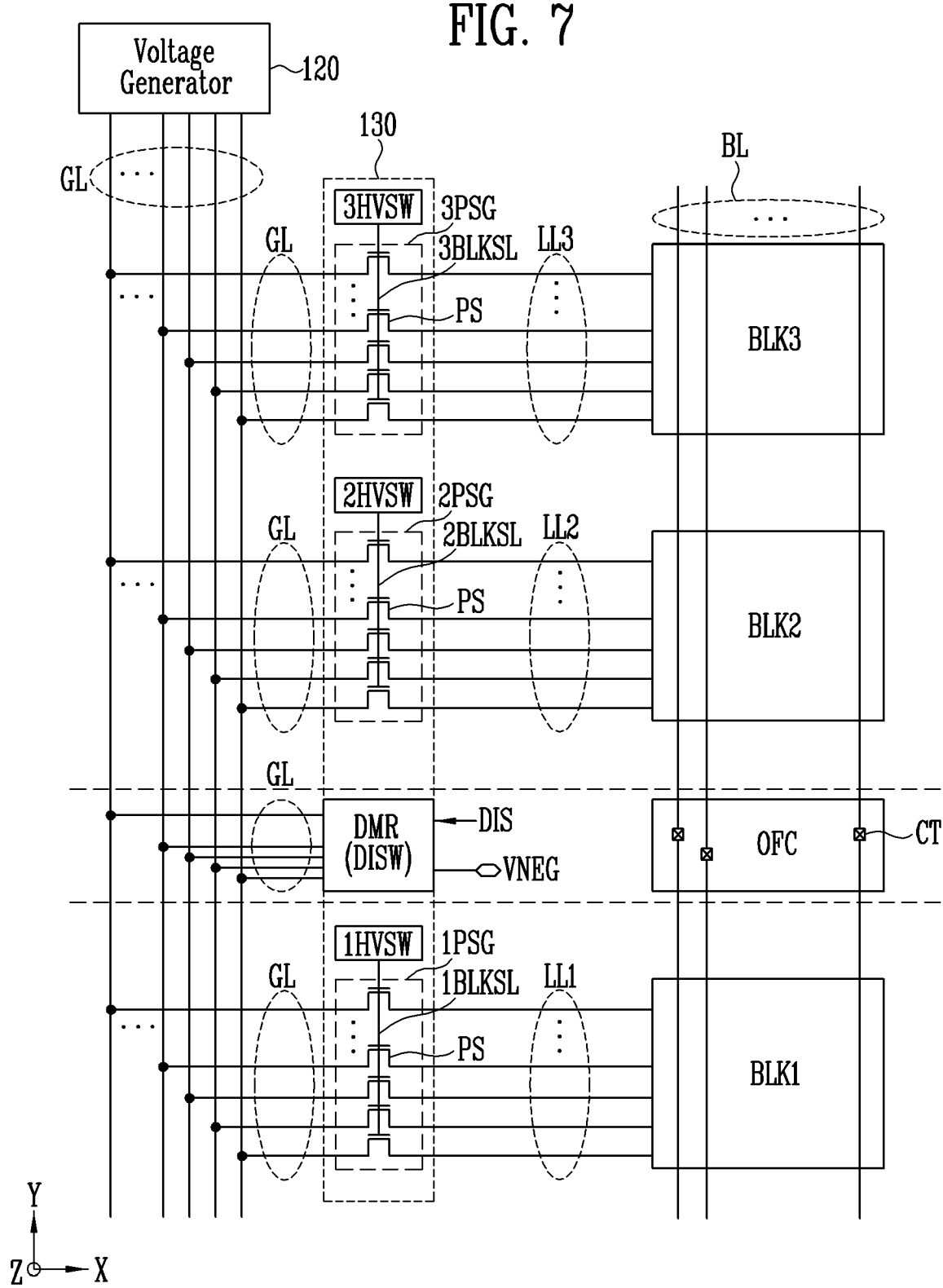
FIG. 7 is a diagram illustrating a peripheral circuit including a dummy region in accordance with an embodiment of the present disclosure.

FIG. 7 is a diagram illustrating a peripheral circuit including a dummy region in accordance with an embodiment of the present disclosure.

Referring to FIG. 7, the voltage generator 120 may generate operating voltages, and the generated operating voltages may be output to global lines GL. The row decoder 130 may be connected between the voltage generator 120 and memory blocks BLK1 to BLK3. For helping to understand this embodiment, first to third memory blocks BLK1 to BLK3 are illustrated in FIG. 7. However, this embodiment is not limited to the number of memory blocks shown in FIG. 7. The row decoder 130 may be connected to the voltage generator 120 through the global lines GL, and be connected to the first to third memory blocks BLK1 to BLK3 through first to third local lines LL1 to LL3. The row decoder 130 is commonly connected to the voltage generator 120 through the global lines GL, but may be respectively connected to the first to third memory blocks BLK1 to BLK3 through the first to third local lines LL1 to LL3. The row decoder 130 will be described in more detail as follows.

The row decoder 130 may include first to third pass switch groups 1PSG to 3PSG and first to third high voltage switches 1HVSW to 3HVSW, which respectively correspond to the first to third memory blocks BLK1 to BLK3. For example, the first pass switch group 1PSG and the first high voltage switch 1HVSW may correspond to the first memory block BLK1, the second pass switch group 2PSG and the second high voltage switch 2HVSW may correspond to the second memory block BLK2, and the third pass switch group 3PSG and the third high voltage switch 3HVSW may correspond to the third memory block BLK3.

The first pass switch group 1PSG may include pass switches PS respectively connected between the global lines GL and the first local lines LL1. The pass switches PS may be implemented with a high voltage NMOS transistor capable of transmitting a high voltage. For example, drains of the high voltage NMOS transistors may be connected to the global lines GL, and sources of the high voltage NMOS transistors may be connected to the first local lines LL1. Gates of the high voltage NMOS transistors may be commonly connected to a first block select line 1BLKSL, and the first block select line 1BLKSL may be connected to the first high voltage switch 1HVSW.

The first high voltage switch 1HVSW may selectively output a high voltage to the first block select line 1BLKSL to simultaneously turn on or turn off the pass switches PS in response to an input row address. For example, when the first memory block BLK1 is selected in a program, read or erase operation, the first high voltage switch 1HVSW may generate a high voltage in response to a row address for selecting the first memory block BLK1, and output the generated high voltage through the first block select line 1BLKSL. When the high voltage is applied to the first block select line 1BLKSL, the pass switches PS included in the first pass switch group 1PSG may be simultaneously turned on. Therefore, the global lines GL may be electrically connected to the first local lines LL1, and operating voltages may be applied to the selected first memory block BLK1. The other second and third high voltage switches 2HVSW and 3HVSW do not output the high voltage in response to the row address, and therefore, the second and third memory blocks BLK2 and BLK3 may be unselected.

The first memory block BLK1, the first local lines LL1, and the first pass switch group 1PSG are connected to each other in the X direction, and the second and third memory blocks BLK2 and BLK3, the second and third local lines LL2 and LL3, and the second and third pass switch groups 2PSG and 3PSG are also connected each other in the X direction. In this structure, a dummy region DMR may be formed in a portion of a region extending in the X direction with respect to an open-for-contact region OFC. For example, the dummy region DMR may be formed between the first and second pass switch groups 1PSG and 2PSG.

The dummy region DMR is an unused region formed due to the open-for-contact region OFC in a manufacturing process of the memory device and may be formed in a region extending in the X, Y or Z direction with respect to the open-for-contact region OFC. For example, contacts CT formed in the open-for-contact region OFC may be respectively connected to bit lines BL. When the bit lines BL are disposed spaced apart from each other in the X direction, the dummy region DMR may also be disposed spaced apart from the open-for-contact region OFC in the X direction. Since memory cells are not formed in the open-for-contact region OFC, the local lines are not connected to the open-for-contact region OFC. Therefore, local lines are not connected to the dummy region DMR.

When the dummy region DMR is maintained as an unused region in the memory device, the number and size of dummy regions DMR increase as the number and size of open-for-contact regions OFC increases. Therefore, the size of the memory device may increase.

Accordingly, in this embodiment, some switches, which are a part of the peripheral circuit, are formed in the dummy region DMR so that an increase in size of the memory device can be prevented. In this embodiment, the dummy region DMR is formed in the row decoder 130 and switches as a part of the row decoder 130 are formed in the dummy region DMR. For example, the row decoder 130 includes a discharge switch DISW for discharging the global lines GL. Thus, a discharge switch DISW is formed in the dummy region DMR, so that the size of the row decoder 130 can decrease. Accordingly, the size of the memory device including the row decoder 130 can decrease. That is, in a memory device including the open-for-contact region OFC, a part (e.g., the discharge switch DISW) of the row decoder 130 may be formed in the dummy region DMR, which occupies a space as unused within the memory device due to the open-for-contact region OFC. Therefore, the space occupation of the row decoder 130 may be reduced within the memory device due to the dummy region DMR. According to an embodiment, the unused space of the dummy region DMR may become occupied by the part of the row decoder 130 and thus the size of the memory device may not increase even with the open-for-contact region OFC. In accordance with this embodiment, when the discharge switch DISW is formed in the dummy region DMR, a discharge signal DIS for turning on or turning off the discharge switch DISW may be applied to the dummy region DMR, and a negative voltage VNEG for discharging the global lines GL may be applied to the dummy region DMR. In this embodiment, the discharge switch DISW used in the row decoder 130 is formed in the dummy region DMR. However, when a layout is changed, some switches used in the row decoder 130 may also be formed in the dummy region DMR.

Figure 8:
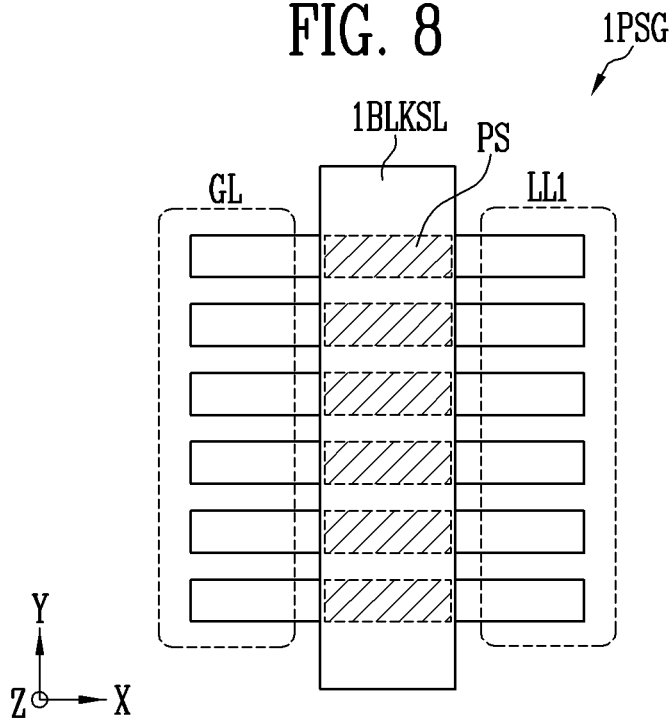
FIG. 8 is a view illustrating a layout of a pass switch group in accordance with an embodiment of the present disclosure.

FIG. 8 is a view illustrating a layout of a pass switch group in accordance with an embodiment of the present disclosure.

Referring to FIG. 8, the first pass switch group 1PSG is illustrated as an example to compare the layout of the switch group with a layout of the dummy region in accordance with this embodiment. The first pass switch group 1PSG may include a plurality of pass switches PS which are connected between the global lines GL and the first local lines LL1, and are commonly connected to the first block select line 1BLKSL. For example, the pass switches PS may be implemented with an NMOS transistor which electrically connects the global lines GL and the first local lines LL1 in response to a first block select signal.

Figure 9A:
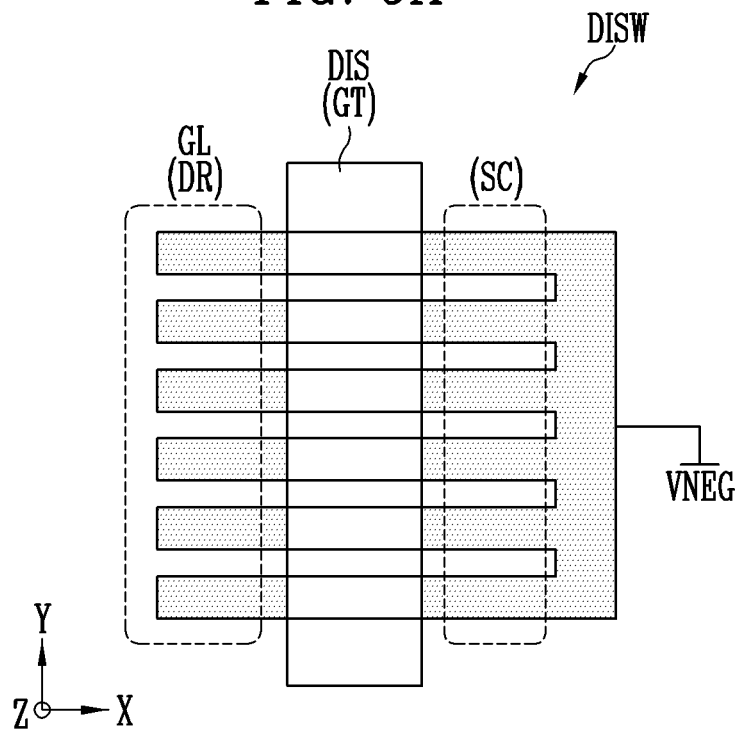
FIGS. 9A and 9B are views illustrating a discharge switch in accordance with a first embodiment of the present disclosure.
Figure 9B:
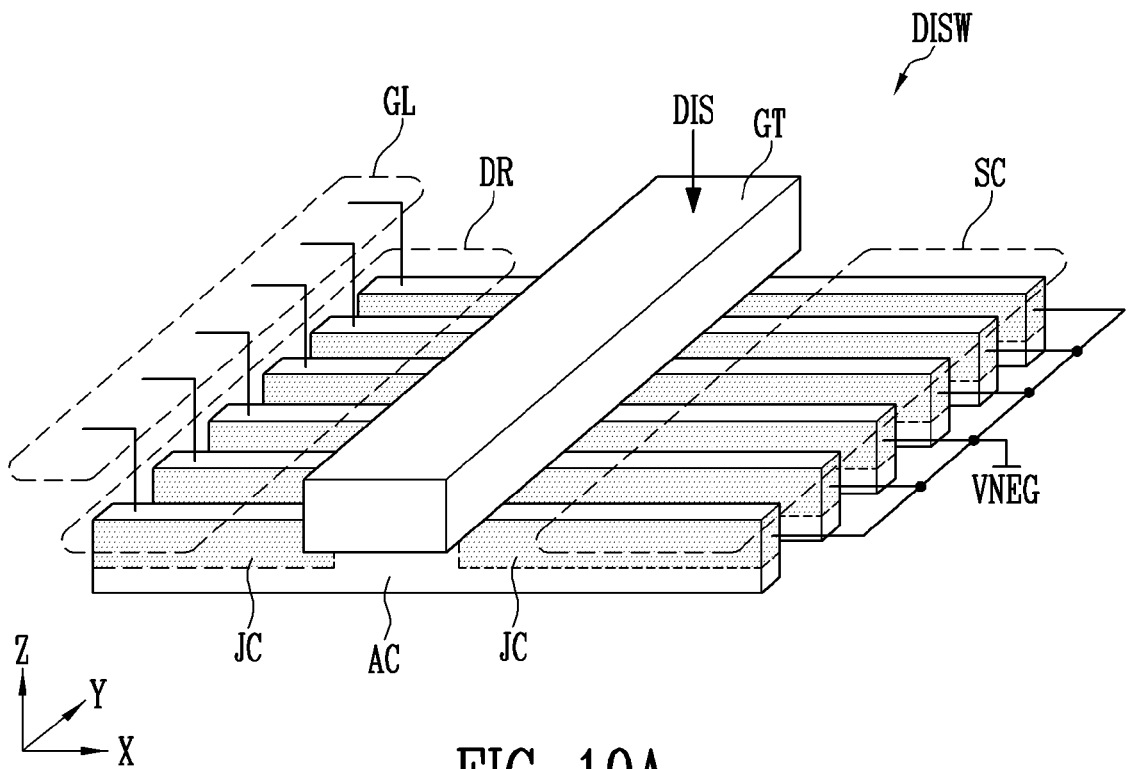

FIGS. 9A and 9B are views illustrating a discharge switch in accordance with a first embodiment of the present disclosure.

Referring to FIG. 9A, the discharge switch DISW may be implemented with an NMOS transistor having a drain DR, a source SC, and a gate GT. For example, the drain DR of the discharge switch DISW may be connected to the global lines, a negative voltage VNEG may be supplied to the source SC of the discharge switch DISW, and a discharge signal DIS may be applied to the gate GT of the discharge switch DISW. That is, while the pass switches PS included in the first pass switch group 1PSG are connected to the first local lines LL1 as shown in FIG. 8, the discharge switch DISW may be connected to the source SC instead of the local lines as shown in FIG. 9A.

The structure of the discharge switch DISW will be described in more detail as follows.

Referring to FIG. 9B, the drain DR and the source SC of the discharge switch DISW may be junction regions JC formed in actives AC. The global lines GL may be connected to the junction regions JC of the drain DR, and the negative voltage VNEG may be supplied to the junction regions JC of the source SC. The active AC may be formed of a semiconductor material, and the junction regions JC may be regions in which ions are doped into a semiconductor material. Therefore, when the discharge signal DIS is not applied to the gate GT of the discharge switch DISW, the drain DR and the source SC may be electrically blocked from each other. When the discharge signal DIS is applied to the gate GT of the discharge switch DISW, a channel may be formed in the actives AC under the gate GT, so that the drain DR and the source SC are electrically connected to each other. Therefore, when the discharge signal DIS is applied to the gate GT of the discharge switch DISW, a voltage of the global lines GL is extracted to a terminal to which the negative voltage VNEG is supplied, and therefore, the global lines GL may be discharged.

The discharge switch DISW may be formed with various layouts in addition to the layout of the first embodiment, and the various layouts will be described with reference to FIGS. 10A and 10B.

Figure 10A:
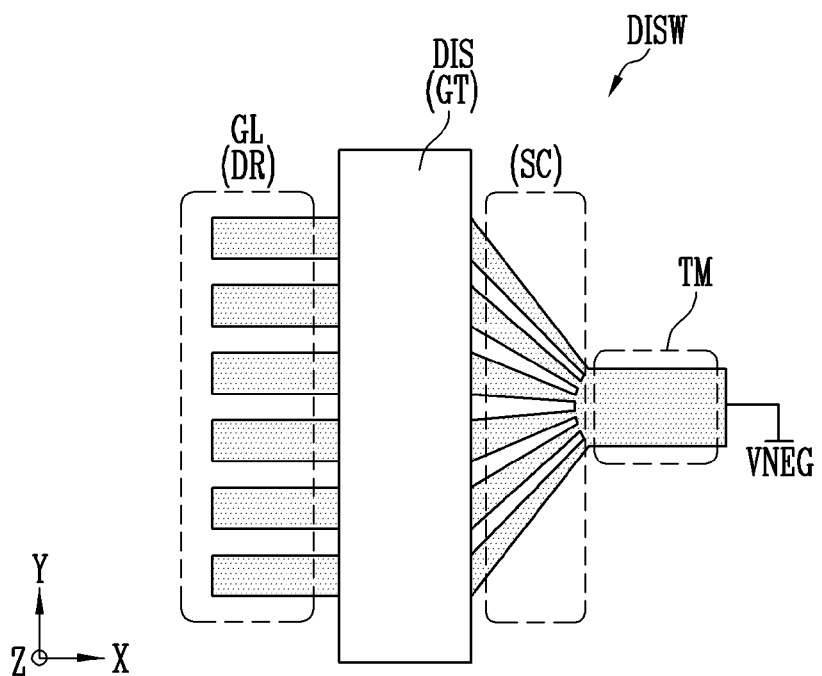
FIG. 10A is a view illustrating a discharge switch in accordance with a second embodiment of the present disclosure.

FIG. 10A is a view illustrating a discharge switch in accordance with a second embodiment of the present disclosure. FIG. 10B is a view illustrating a discharge switch in accordance with a third embodiment of the present disclosure.

Referring to FIG. 10A, the global lines GL may be connected to a drain DR of the discharge switch DISW in accordance with the second embodiment, and the negative voltage VNEG may be supplied to a source SC of the discharge switch DISW. Actives in which the drain DR is formed may extend up to a region in which the source SC is formed through a gate GT of the discharge switch DISW, and actives in which the source SC is formed may be commonly in contact with a terminal TM to which the negative voltage VNEG is supplied. A width (Y direction) of the terminal TM may be formed narrower than that (Y direction) of a region in which the drain DR is formed.

Figure 10B:
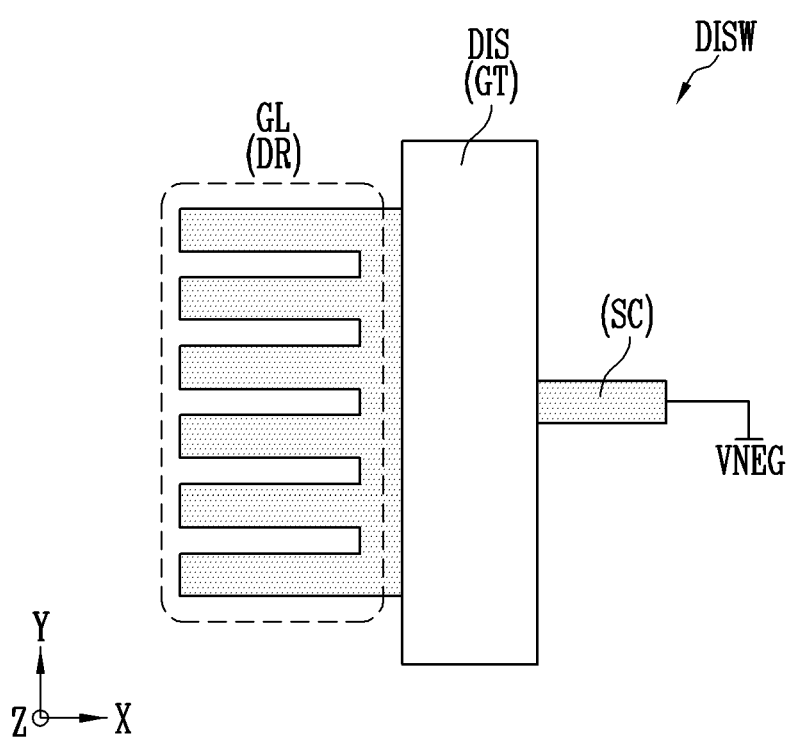
FIG. 10B is a view illustrating a discharge switch in accordance with a third embodiment of the present disclosure.

Referring to FIG. 10B, the global lines GL may be connected to a drain DR of the discharge switch DISW in accordance with the third embodiment, and the negative voltage VNEG may be supplied to a source SC of the discharge switch DISW. Actives in which the drain DR is formed may be in contact with one active, and the one active may extend to the source SC through a gate GT of the discharge switch DISW. A width (Y direction) of a region in which the source SC is formed may be formed narrower than that (Y direction) of a region in which the drain DR is formed.

Figure 11:
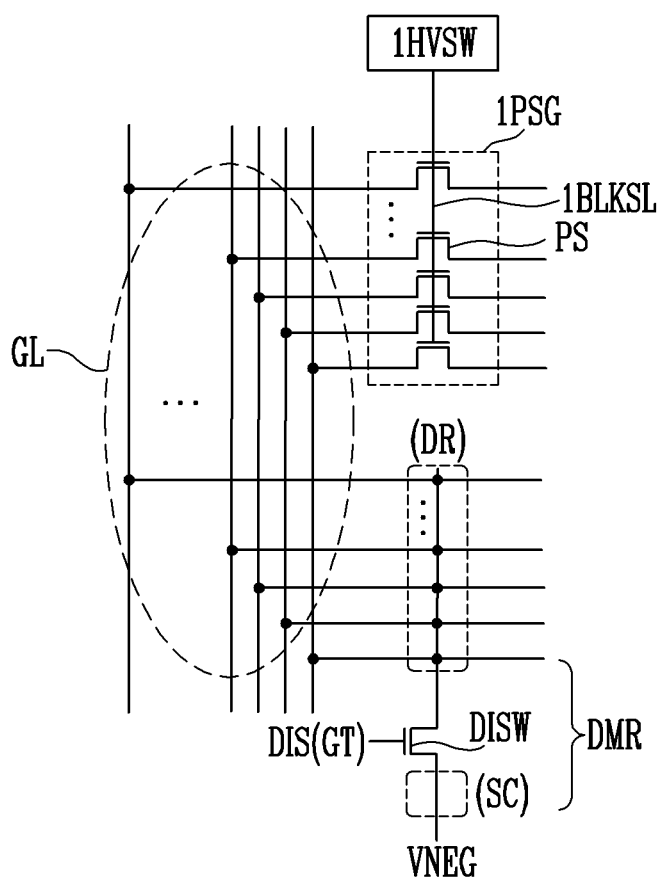
FIG. 11 is a diagram illustrating a connection configuration of a discharge switch in accordance with an embodiment of the present disclosure.

FIG. 11 is a diagram illustrating a connection configuration of a discharge switch in accordance with an embodiment of the present disclosure.

Referring to FIG. 11, the discharge switch DISW may be formed in a dummy region DMR. A drain DR of the discharge switch DISW may be commonly connected to the global lines GL, and the negative voltage VNEG may be supplied to a source of the discharge switch DISW. When the discharge signal DIS having a positive voltage level is applied to a gate GT of the discharge switch DISW, the discharge switch DISW is turned on, and therefore, the global lines GL may be discharged.

Figure 12:
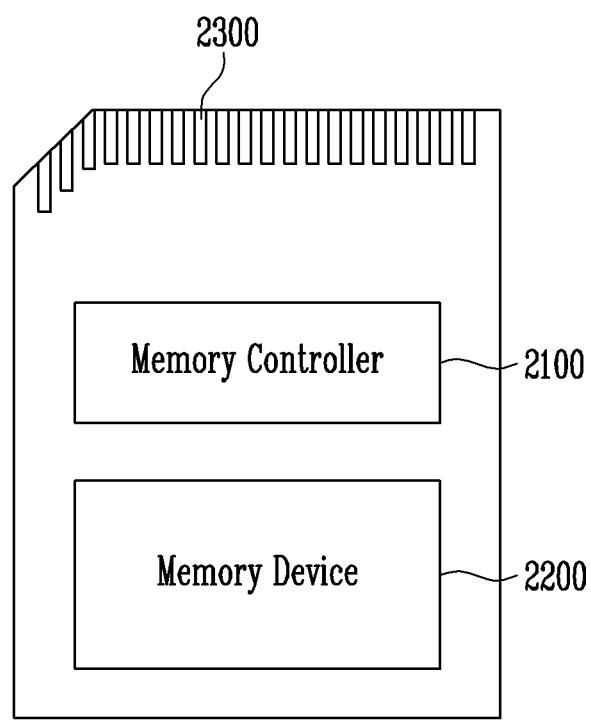
FIG. 12 is a diagram illustrating a memory card system to which the memory device in accordance with an embodiment of the present disclosure is applied.

FIG. 12 is a diagram illustrating a memory card system to which the memory device in accordance with an embodiment of the present disclosure is applied.

Referring to FIG. 12, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control a program, read or erase operation of the memory device 2200, or control a background operation of the memory device 2200. The memory controller 2100 provides an interface between the memory device 2200 and a host Host. The memory controller 2100 drives firmware for controlling the memory device 2200. The memory device 2200 may be configured similar to the storage device 1100 described with reference to FIG. 1.

The memory controller 2100 may communicate with an external device through the connector 2300. The memory controller 2100 may communicate with the external device (e.g., the host) according to a specific communication protocol. The memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be defined by at least one of the above-described various communication protocols.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 13:
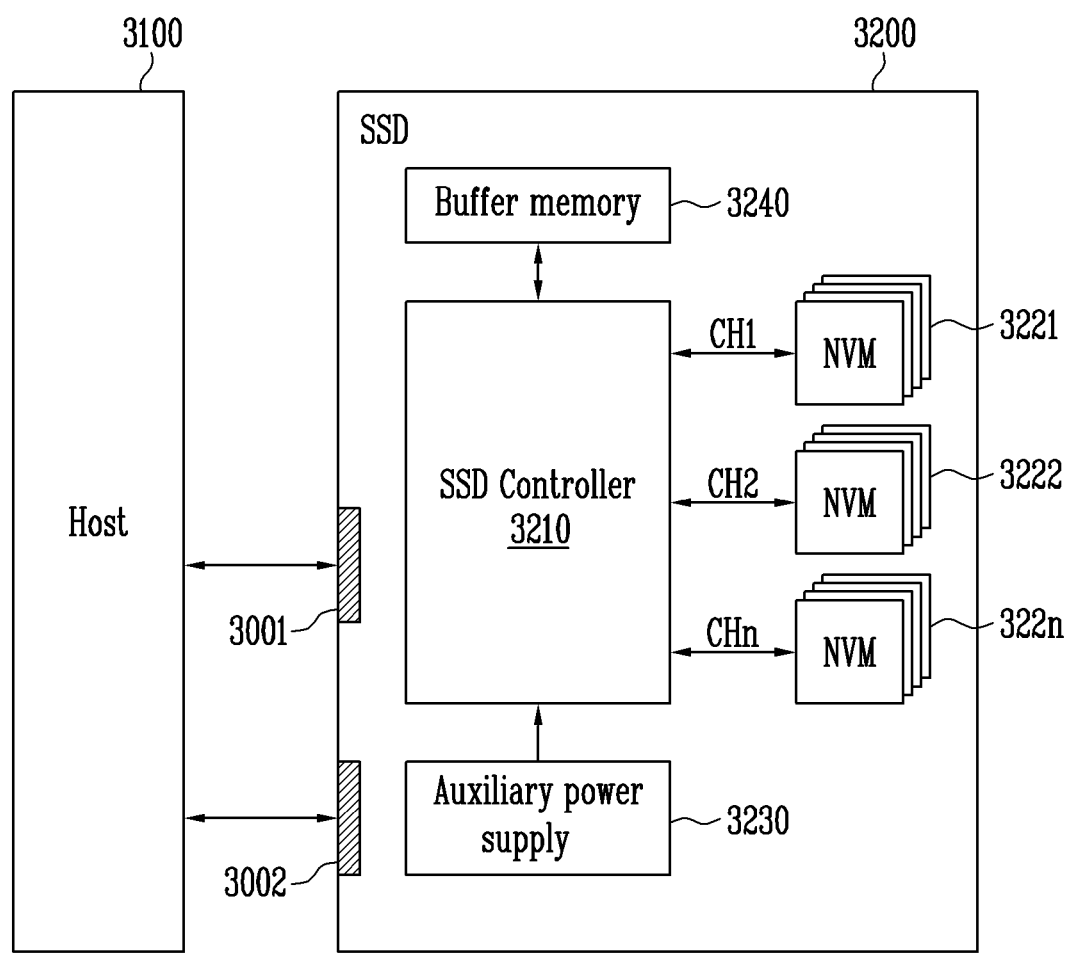
FIG. 13 is a diagram illustrating a Solid State Drive (SSD) system to which the memory device in accordance with an embodiment of the present disclosure is applied.

FIG. 13 is a diagram illustrating a Solid State Drive (SSD) system to which the memory device in accordance with an embodiment of the present disclosure is applied.

Referring to FIG. 13, the SSD system 3000 includes a host 3100 and an SSD 3200. The SSD 3200 exchanges a signal with the host 3100 through a signal connector 3001, and receives a power voltage through a power connector 3002. The SSD 3200 includes an SSD controller 3210, a plurality of flash memories 3221 to 322n, an auxiliary power supply 3230, and a buffer memory 3240.

In accordance with an embodiment of the present disclosure, the flash memories 3221 to 322n may be configured similar to the memory device MD described with reference to FIG. 2.

The SSD controller 3210 may control the plurality of flash memories 3221 to 322n in response to a signal received from the host 3100. The signal may be a signal based on an interface between the host 3100 and the SSD 3200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power input from the host 3100, and charge the power. When the supply of power from the host 3100 is not smooth, the auxiliary power supply 3230 may provide power to the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, the size of the memory device can decrease.

Various embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

From the foregoing it will be appreciated that, although specific embodiments of the invention have been described herein for purposes of illustration, various modifications may be made without deviating from the spirit and scope of the invention. Accordingly, the invention should not be limited except according to the following appended claims.

What is claimed is:

1. A memory device comprising:
   memory blocks disposed spaced apart from each other in a first direction and connected to bit lines disposed spaced apart from each other in a second direction perpendicular to the first direction and local lines disposed spaced apart from each other in the first direction;
   an open-for-contact region located between the memory blocks; and
   a row decoder disposed between global lines to which an operating voltage is supplied and the local lines and configured to transfer the operating voltage to one memory block among the memory blocks in response to a row address,
   wherein a plurality of contacts are formed in the open-for-contact region and configured to transmit a voltage between the bit lines and a peripheral circuit, wherein a dummy region is included in the row decoder and disposed paced apart from the open-for-contact region in the second direction, and wherein a discharge switch is included in the dummy region and configured to discharge the global lines in response to a discharge signal.

2. The memory device of claim 1, wherein the row decoder further includes high voltage switches and pass switch groups, which correspond to the respective memory blocks.

3. The memory device of claim 2, wherein the high voltage switches output a block select signal in response to the row address, and wherein the pass switch groups connect the global lines and selected local lines to each other in response to the block select signal.

4. The memory device of claim 3, wherein the discharge switch is located between the pass switch groups.

5. The memory device of claim 4, wherein the discharge switch is implemented with a transistor, and wherein the transistor includes:

a drain commonly connected to the global lines;

a source to which a negative voltage is supplied; and a gate located between the drain and the source and configured to electrically connect the drain and the source to each other in response to the discharge signal.

6. The memory device of claim 5, wherein the drain and the source are formed in a group of actives, and wherein the actives are disposed spaced apart from each other in the first direction.

7. The memory device of claim 6, wherein the gate is formed on a top of the actives.

8. A memory device comprising:

a plurality of memory blocks disposed in a first direction and connected to local lines, respectively;

global lines to which an operating voltage is applied;

a plurality of pass switch groups disposed in the first direction, wherein each pass switch group of the plurality of pass switch groups is configured to connect the local lines, which are connected to a memory block located in a second direction at a position of each pass switch group among the plurality of memory blocks, to the global lines in response to a row address;

an open-for-contact region located between two memory blocks among the plurality of memory blocks; and a discharge switch located in the second direction at a position of the open-for-contact region and configured to discharge the global lines in response to a discharge signal.

9. The memory device of claim 8, further comprising:

a plurality of high voltage switches connected to the plurality of pass switch groups, respectively.

10. The memory device of claim 8, wherein the discharge switch is disposed between a first pass switch group and a second pass switch group among the plurality of pass switch groups, and wherein the first pass switch group is connected to local lines of a first memory block, and the second pass switch group is connected to local lines of a second memory block, among the two memory blocks.

11. The memory device of claim 8, wherein the discharge switch is commonly connected to the global lines.

12. The memory device of claim 8, wherein the discharge switch is implemented with a transistor, and wherein the transistor includes:

a drain commonly connected to the global lines;

a source to which a negative voltage is supplied; and a gate configured to electrically connect the drain and the source to each other in response to the discharge signal.

13. The memory device of claim 8, further comprising a logic circuit configured to output the discharge signal after a selected operation is performed on the memory block.

14. A memory device comprising:

a plurality of memory blocks configured to store data and connected to local lines and bit lines;

an open-for-contact region, which is located between two memory blocks among the plurality of memory blocks, comprising contacts connected to the bit lines;

page buffers connected to the bit lines through the contacts;

a voltage generator configured to generate operating voltages and output the operating voltages to global lines;

a plurality of pass switch groups configured to transmit the operating voltages of the global lines to a selected memory block among the plurality of memory blocks; and a discharge switch located between two pass switch groups among the plurality of pass switch groups, and configured to discharge the global lines in response to a discharge signal, wherein the two pass switch groups are connected to the two memory blocks, respectively.

15. The memory device of claim 14, wherein each of the plurality of pass switch groups and the discharge switch are commonly connected to the global lines.

16. The memory device of claim 14, wherein the plurality of pass switch groups include pass switches respectively connected between the global lines and the local lines.

17. The memory device of claim 14, wherein the discharge switch is implemented with a transistor, and wherein the transistor includes:

a drain commonly connected to the global lines;

a source to which a negative voltage is supplied; and a gate configured to electrically connect the drain and the source to each other in response to the discharge signal.

18. The memory device of claim 17, wherein the drain and the source are formed in a group of actives, and wherein the gate is formed on a top of the actives.

* * * * *